(12) United States Patent
Ichinokura et al.

(10) Patent No.: US 11,677,052 B2
(45) Date of Patent: Jun. 13, 2023

(54) SEMICONDUCTOR LIGHT-EMITTING DEVICE

(71) Applicant: NIKKISO CO., LTD., Tokyo (JP)

(72) Inventors: Hiroyasu Ichinokura, Ishikawa (JP); Tadaaki Maeda, Ishikawa (JP); Kazuyoshi Sakuragi, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 35 days.

(21) Appl. No.: 16/973,280

(22) PCT Filed: Jun. 6, 2019

(86) PCT No.: PCT/JP2019/022524
§ 371 (c)(1),
(2) Date: Dec. 8, 2020

(87) PCT Pub. No.: WO2019/235565
PCT Pub. Date: Dec. 12, 2019

(65) Prior Publication Data
US 2021/0249573 A1    Aug. 12, 2021

(30) Foreign Application Priority Data

Jun. 8, 2018  (JP) .............................. JP2018-110055

(51) Int. Cl.
*H01L 33/54* (2010.01)
*H01L 33/46* (2010.01)
(Continued)

(52) U.S. Cl.
CPC .............. *H01L 33/54* (2013.01); *H01L 33/46* (2013.01); *H01L 33/56* (2013.01)

(58) Field of Classification Search
CPC .............................. H01L 33/54; H01L 33/486
See application file for complete search history.

(56) References Cited

U.S. PATENT DOCUMENTS

| 2007/0194327 A1 | 8/2007 | Ueda et al. |
| 2013/0049565 A1 | 2/2013 | Jung et al. |

(Continued)

FOREIGN PATENT DOCUMENTS

| CN | 103875085 A | 6/2014 |
| CN | 104518061 A | 4/2015 |

(Continued)

OTHER PUBLICATIONS

Translation of International Preliminary Report on Patentability and Written Opinion dated Dec. 17, 2020 issued in PCT/JP2019/022524.

(Continued)

*Primary Examiner* — Antonio B Crite
(74) *Attorney, Agent, or Firm* — Scully, Scott, Murphy & Presser, PC

(57) ABSTRACT

A semiconductor light-emitting device includes a semiconductor light-emitting element having a supporting substrate and a sealing member located above the supporting substrate, a mounting substrate on which the semiconductor light-emitting element is mounted in such a manner that the sealing member faces the mounting substrate, and a sealing part that integrally covers a part of the supporting substrate and a side surface of the sealing member and seals the semiconductor light-emitting element and the mounting substrate.

8 Claims, 12 Drawing Sheets

(51) Int. Cl.
    *H01L 33/56*     (2010.01)
    *H01L 33/48*     (2010.01)
    *H01L 33/60*     (2010.01)

(56) References Cited

U.S. PATENT DOCUMENTS

| | | |
|---|---|---|
| 2015/0091042 A1 | 4/2015 | Kim et al. |
| 2015/0295139 A1 | 10/2015 | Park et al. |
| 2016/0197253 A1 | 7/2016 | Miyashita et al. |

FOREIGN PATENT DOCUMENTS

| | | |
|---|---|---|
| EP | 2765620 A1 | 8/2014 |
| JP | S59-096749 A | 6/1984 |
| JP | 2001-203291 A | 7/2001 |
| JP | 2007-235122 A | 9/2007 |
| JP | 2009-231351 A | 10/2009 |
| JP | 2010-153561 A | 7/2010 |
| JP | 2011-40577 A | 2/2011 |
| JP | 2011-210974 A | 10/2011 |
| JP | 2014-529200 A | 10/2014 |
| JP | 2017-45832 A | 3/2017 |
| KR | 1020130038053 A | 4/2013 |
| KR | 1020150035113 A | 4/2015 |
| KR | 1020150052513 A | 5/2015 |
| TW | 201143150 A | 12/2011 |
| TW | 201511367 A | 3/2015 |
| TW | 201921737 A | 6/2019 |
| WO | 2013/051906 A1 | 4/2013 |
| WO | 2014/208495 A1 | 12/2014 |
| WO | WO-2019043840 A1 * | 3/2019 ............. H01L 33/52 |

OTHER PUBLICATIONS

International Search Report dated Sep. 10, 2019 issued in PCT/JP2019/022524.
Official Action issued in Taiwan Patent Application No. 108119752 dated Jul. 13, 2022 together with English language translation.
Search Report issued in Taiwan Patent Application No. 108119752 dated Jul. 13, 2022.
Japanese Official Action dated Nov. 15, 2022 from related JP 2022-062994 together with English language translation.
Japanese Official Action dated Feb. 7, 2023 from related JP 2022-062994 together with English language translation.

* cited by examiner

SEMICONDUCTOR LIGHT-EMITTING DEVICE

TECHNICAL FIELD

The invention relates to a semiconductor light-emitting device.

BACKGROUND ART

A light-emitting device is known, in which a decrease in reliability due to poor connection or poor sealing of an LED element is suppressed by reducing internal stress induced in a glass lid due to strain caused by a recess formation process or a fusing process (see PL1).

To provide the light-emitting device described in PL1, heat treatment is performed as stress reduction treatment to reduce stress generated by assembly process of the light-emitting device in a light-emitting device manufacturing method in which an LED element is mounted on an inorganic material substrate and a glass lid obtained by forming a recess on a flat glass plate is placed on the inorganic material substrate to enclose the LED element-mounting region and is then sealed by metal welding.

CITATION LIST

Patent Literature

PL1: JP2011-40577A

SUMMARY OF INVENTION

Technical Problem

It is an object of the invention to provide a semiconductor light-emitting device in which a semiconductor light-emitting element is less likely to come off from a mounting substrate without performing stress reduction treatment.

Solution to Problem

A semiconductor light-emitting device in an embodiment of the invention is provided with a semiconductor light-emitting element comprising a supporting substrate and a sealing member located above the supporting substrate; a mounting substrate on which the semiconductor light-emitting element is mounted in such a manner that the sealing member faces the mounting substrate; and a sealing part that integrally covers a part of the supporting substrate and the side surface of the sealing member and seals the semiconductor light-emitting element and the mounting substrate.

Advantageous Effects of Invention

According to an embodiment of the invention, it is possible to provide a semiconductor light-emitting device in which a semiconductor light-emitting element can be suppressed from coming off from a mounting substrate without performing stress reduction treatment.

DESCRIPTION OF EMBODIMENTS

Embodiments

Embodiments of the invention will be described in reference to FIGS. 1 to 6. The embodiments below are described as preferred examples for implementing the invention. Although some part of the embodiments specifically illustrates various technically preferable matters, the technical scope of the invention is not limited to such specific aspects. In addition, a scale ratio of each constituent element in each drawing is not necessarily the same as the actual scale ratio.

First Embodiment

Figure 1:
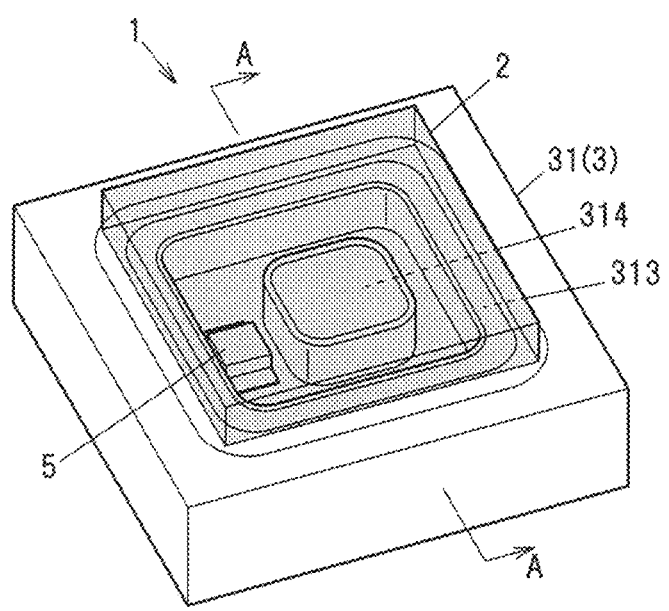
FIG. 1 is a schematic perspective view showing an example configuration of a semiconductor light-emitting device in the first embodiment of the present invention.

FIG. 1 is a schematic perspective view showing an example configuration of a semiconductor light-emitting device in the first embodiment of the invention. As shown in FIG. 1, a semiconductor light-emitting device 1 is provided with a semiconductor light-emitting element 2 which emits light in a predetermined wavelength region such as ultraviolet light, a voltage regulating element 5 which maintains a constant voltage value regardless of a current value, and a mounting substrate 3 on which the semiconductor light-emitting element 2 and the voltage regulating element 5 are mounted. The details of the semiconductor light-emitting element 2 and the mounting substrate 3 will be described later. As the voltage regulating element 5, it is possible to use, e.g., Zener diode.

Figure 2:
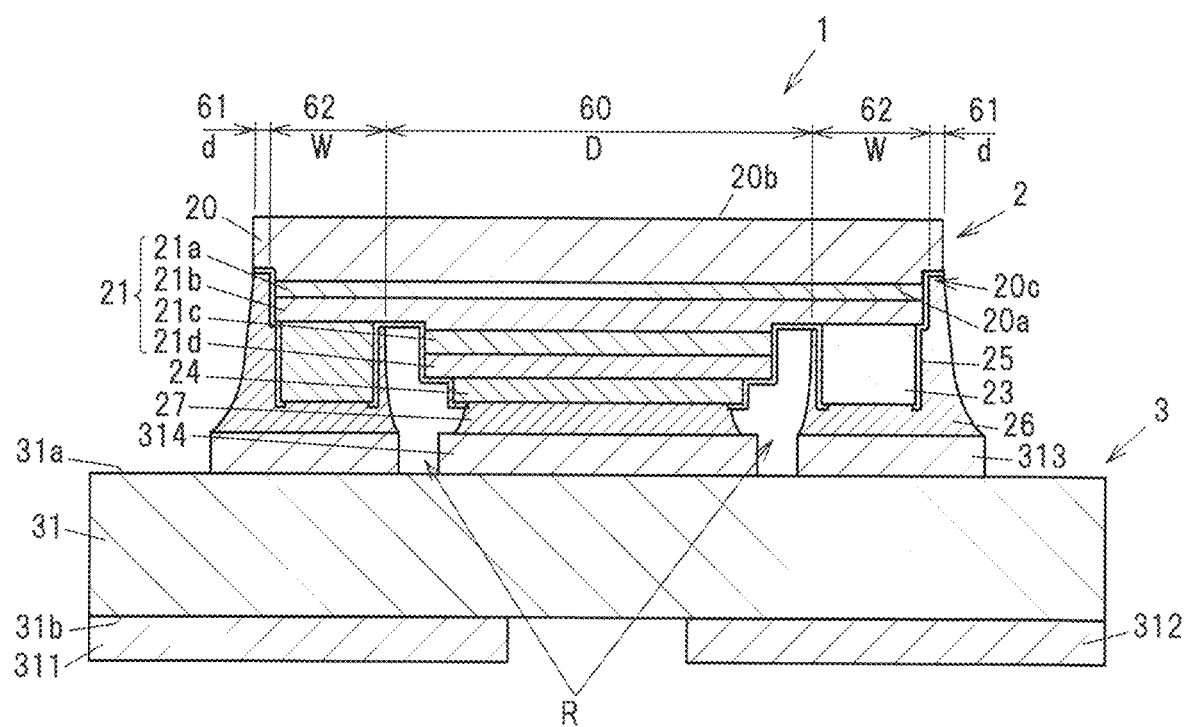
FIG. 2 is a vertical cross-sectional view taking along A-A in FIG. 1.

FIG. 2 is a cross-sectional view taken along A-A in FIG. 1. As shown in FIG. 2, the semiconductor light-emitting device 1 is further provided with a sealing part 26 and a joint part 27 which connect the semiconductor light-emitting element 2 to the mounting substrate 3. Next, each constituent element will be described.

(Semiconductor Light-Emitting Element 2)

Examples of the semiconductor light-emitting element 2 includes transistor, laser diode (LD), light-emitting diode (LED), etc. In the first embodiment, a light-emitting diode which emits light with a wavelength in the ultraviolet region (especially, deep ultraviolet light with a central wavelength of 230 nm to 360 nm) is described as an example of the semiconductor light-emitting element 2.

The semiconductor light-emitting element 2 is flip-chip mounted on a base part 31 of the mounting substrate 3, with the supporting substrate 20 side facing upward (a direction from the mounting substrate 3 to the semiconductor light-emitting element 2) and the first and second electrodes 23, 24 side facing downward (a direction from the semiconductor light-emitting element 2 to the mounting substrate 3). In other words, the semiconductor light-emitting element 2 is mounted on the mounting substrate 3 in such a manner that the first electrode 23 and the second electrode 24 face the mounting substrate 3.

In the following description, "lower/down/below" (e.g., "lower surface", "lower side", "downward", etc.) means the supporting substrate 20 side (the upper side in the drawings) and "upper/up/above" (e.g., "upper surface", "upper side", "upward", etc.) means the first and second electrodes 23, 24 side (the lower side in the drawings) only when each layer of the semiconductor light-emitting element 2 is described. Meanwhile, when the constituent elements other than the semiconductor light-emitting element 2 are described, the directions are as seen in the drawings. In addition, "on" or "under" indicates a relative position of one object to another object, and includes not only a state in which the one object is arranged on or under the other object without a third object in-between but also a state in which the one object is arranged on or under the other object with the third object in-between.

When viewed from above, the semiconductor light-emitting element 2 has, e.g., a rectangular shape such as a substantially square shape or a substantially rectangular shape. The configuration of the semiconductor light-emitting element 2 shown in FIG. 2 is an example, and the configuration of the semiconductor light-emitting element 2 is not limited to that shown in FIG. 2. For example, other semiconductor layers which may correspond to those provided in a known technique may be appropriately added.

As shown in FIG. 2, the semiconductor light-emitting element 2 has, e.g., a supporting substrate 20, an AlGaN-based nitride semiconductor layer 21 formed on the supporting substrate 20, a first electrode 23, a second electrode 24, and an insulation layer 25.

The nitride semiconductor layer 21 is configured that a buffer layer 21a including AlN, an n-type cladding layer 21b including AlGaN with n-type conductivity (hereinafter, also simply referred to as "n-type AlGaN"), an active layer 21c including AlGaN, and a p-type cladding layer 21d including AlGaN with p-type conductivity (hereinafter, also simply referred to as "p-type AlGaN") are sequentially formed from the supporting substrate 20 side. Additionally, a p-type contact layer (not shown) formed of p-type GaN or an electron blocking layer (not shown) formed of p-type AlGaN with an Al composition ratio having not less than a predetermined value may be provided on the p-type cladding layer 21d.

The AlGaN-based nitride semiconductor which can be used to form the nitride semiconductor layer 21 is, e.g., a binary, ternary, or quaternary group III nitride semiconductor which is expressed by $Al_xGa_yIn_{1-x-y}N$ ($0 \leq x \leq 1$, $0 \leq y \leq 1$, $0 \leq x+y \leq 1$). In addition, the group III elements thereof may be partially substituted with boron (B) or thallium (Tl), etc., and N may be partially substituted with phosphorus (P), arsenic (As), antimony (Sb) or bismuth (Bi), etc.

Next, a general configuration of each layer constituting the nitride semiconductor layer 21 will be described. In the following description, the center region in which the active layer 21c is formed in a top view of the supporting substrate 20 is referred to as an inner region 60, a region located at the outer rim and having a first width d is referred to as an outer rim region 61, and a region between the inner region 60 and the outer rim region 61 is referred to as an intermediate region 62.

The supporting substrate 20 is transparent to ultraviolet light (particularly, deep ultraviolet light) emitted by the semiconductor light-emitting element 2. The supporting substrate 20 is, e.g., a sapphire ($Al_2O_3$) substrate. Besides the sapphire ($Al_2O_3$) substrate, e.g., an aluminum nitride (AlN) substrate or an aluminum gallium nitride (AlGaN) substrate may be used as the supporting substrate 20.

The supporting substrate 20 has a first principal surface 20a constituting the upper surface, and a second principal surface 20b located opposite to the first principal surface 20a and constituting the lower surface. The first principal surface 20a is a principal surface to be a crystal growth surface for growing the buffer layer 21a and each layer thereabove. The second principal surface 20b is a principal surface to be a light extraction surface from which ultraviolet light (particularly, deep ultraviolet light) emitted by the active layer 21c is extracted to the outside.

Figure 3:
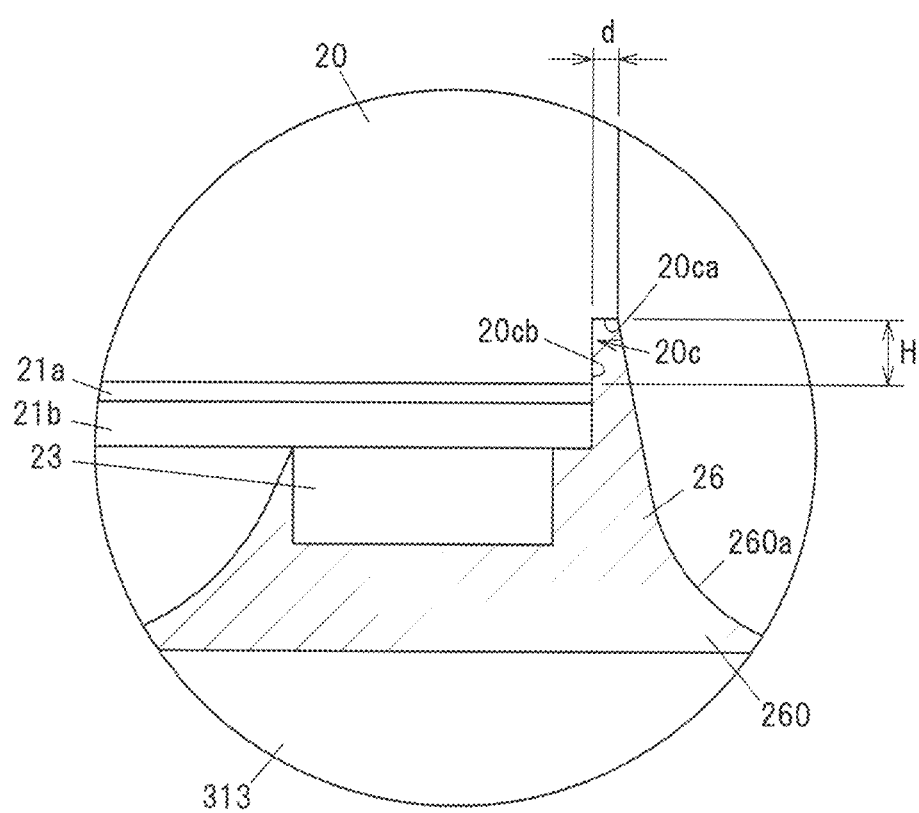
FIG. 3 is an enlarged view showing a sealing part.

A stepped part 20c, which has a bottom surface 20ca with the first width d corresponding to a width of the outer rim region 61 and a wall surface 20cb with a height H, is provided at widthwise edges of the supporting substrate 20 on the first principal surface 20a side (see FIG. 3). The stepped part 20c is formed such that, e.g., corners at the edges of the supporting substrate 20 on the first principal surface 20a side are inwardly cutting out with the first width d. H is preferably not less than 1 nm, more preferably 10 nm to 100 nm, and optimally 20±10 nm. The first width d is, e.g., 5 μm to 35 μm.

The buffer layer 21a is a foundation layer (a template layer) for forming the n-type cladding layer 21b and each layer thereabove and may include an undoped AlN layer. The buffer layer 21a is not formed on the entire surface of the supporting substrate 20 and is formed only in a region of the supporting substrate 20 on the inner side of the outer rim region 61.

The n-type cladding layer 21b is a layer formed of n-type AlGaN and is, e.g., an $Al_pGa_{1-p}N$ layer ($0 \leq p \leq 1$) doped with silicon (Si) as an n-type impurity. Alternatively, germanium (Ge), selenium (Se), tellurium (Te) or carbon (C), etc., may be used as the n-type impurity. The n-type cladding layer 21b has a thickness of about 1 μm to 3 μm and is, e.g., about 2 μm in thickness. The n-type cladding layer 21b is formed only in a region of the buffer layer 21a on the inner side of the outer rim region 61, in the same manner as the buffer layer 21a.

The active layer 21c is a multi-quantum well layer in which barrier layers (not shown) including $Al_rGa_{1-r}N$ and well layers (not shown) including $Al_sGa_{1-s}N$ ($0 \leq r \leq 1$, $0 \leq s \leq 1$, $r > s$) are alternately stacked. The active layer 21c is configured to have, e.g., a band gap of not less than 3.4 eV in such a manner that deep ultraviolet light with a central wavelength of not more than 360 nm is output. The active layer 21c is not formed on the entire surface of the n-type cladding layer 21b and is formed on the n-type cladding layer 21b only in the inner region 60. The inner region 60 is a region having a second width D. The second width D is, e.g., 750 nm to 1200 nm. The second width D corresponds to a width of the active layer 21c and a width of the p-type cladding layer 21d.

The p-type cladding layer 21d is a layer formed of p-type AlGaN and is, e.g., an $Al_qGa_{1-q}N$ cladding layer ($0 \leq q \leq 1$) doped with magnesium (Mg) as a p-type impurity. Alternatively, zinc (Zn), beryllium (Be), calcium (Ca), strontium (Sr) or barium (Ba), etc., may be used as the p-type impurity. The p-type cladding layer 21d has a thickness of about 300 nm to 700 nm and is, e.g., about 400 nm to 600 nm in thickness. The p-type cladding layer 21d is formed on the active layer 21c only in the inner region 60, in the same manner as the active layer 21c.

The first electrode 23 is a cathode-side electrode (n-electrode) formed on the n-type cladding layer 21b. In particular, the first electrode 23 is formed on the n-type cladding layer 21b in the intermediate region 62 and is formed in a shape of frame so as to surround the inner region 60 in which the active layer 21c and the p-type cladding layer 21d are formed (see FIGS. 1 and 2). The first electrode 23 is formed of a multilayered film formed by sequentially stacking titanium (Ti)/platinum (Pt)/gold (Au), or chromium (Cr)/Pt/Au, on the n-type cladding layer 21b.

The first electrode 23 is an electrode also serving as a sealing member for sealing the internal structure of the semiconductor light-emitting device 1, and is provided in the intermediate region 62. A width of the first electrode 23 (hereinafter, "a third width W") corresponding to the width of the intermediate region 62 is preferably not less than 100 More preferably, the third width W is not less than 200 μm.

The second electrode 24 is an anode-side electrode (p-electrode) formed on the p-type cladding layer 21d. In particular, the second electrode 24 is formed of a multilayered film formed by sequentially stacking nickel (Ni)/gold (Au) on the p-type cladding layer 21d.

The insulation layer 25 is a passivation layer which covers and protects an exposed portion of each layer as well as exposed portions of the first electrode 23 and the second electrode 24. The insulation layer 25 is formed of, e.g., silicon oxide ($SiO_2$) or silicon nitride (SiN), etc.

In the outer rim region 61 and the intermediate region 62, the insulation layer 25 covers the bottom surface 20ca and the wall surface 20cb of the stepped part 20c of the supporting substrate 20 (hereinafter, also simply referred to as "the surface of the stepped part 20c"), the side surface of the buffer layer 21a, the lateral and upper surfaces of the n-type cladding layer 21b, and the side surface of the first electrode 23.

In addition, in the inner region 60, the insulation layer 25 covers the side surface of the active layer 21c, the side surface of the p-type cladding layer 21d, and the side surface of the second electrode 24. The insulation layer 25 may further cover portions of the upper surfaces of the first electrode 23 and the second electrode 24. However, the insulation layer 25 may not necessarily be provided.

The semiconductor light-emitting element 2 may be manufactured by forming each layer on the supporting substrate 20 using a well-known epitaxial growth method such as the metalorganic vapor phase epitaxy (MOVPE) method or the molecular beam epitaxy (MBE) method. Meanwhile, removal of the corners at the widthwise edges of the supporting substrate 20, the buffer layer 21a, the n-type cladding layer 21b, the active layer 21c and the p-type cladding layer 21d may be achieved by a well-known technique such as reactive-ion etching or dry etching using plasma, etc.

(Mounting Substrate 3)

The mounting substrate 3 is an example of a package having a flat plate shape. The mounting substrate 3 has the base part 31, a first lower electrode 311 and a second lower electrode 312 which are provided on a lower surface 31b of the base part 31, and a first upper electrode 313 and a second upper electrode 314 which are provided on an upper surface 31a of the base part 31.

The base part 31 is a plate-shaped member having the upper surface 31a and the lower surface 31b. The base part 31 is a ceramic substrate including alumina ($Al_2O_3$) or aluminum nitride (AlN), etc., and is, e.g., a high temperature co-fired ceramic (HTCC) multi-layered substrate.

The first lower electrode 311 and the second lower electrode 312 are electrodes used to mount the semiconductor light-emitting device 1 on an external substrate, etc. The first lower electrode 311 and the second lower electrode 312 serve as the anode electrode or the cathode electrode of the semiconductor light-emitting device 1.

The first upper electrode 313 is an electrode part connected to the first electrode 23 of the semiconductor light-emitting element 2 and has a frame shape corresponding to the first electrode 23 (see FIG. 1). Preferably, the first upper electrode 313 is arranged seamlessly. The first lower electrode 311 is electrically connected to the first upper electrode 313 inside the base part 31.

The second upper electrode 314 is an electrode part connected to the second electrode 24 of the semiconductor light-emitting element 2 and is an island-shaped electrode provided on the inner side of the first upper electrode 313 and having a substantially square shape when viewed from above (see FIG. 1). The second lower electrode 312 is electrically connected to the second upper electrode 314 inside the base part 31.

Both the first upper electrode 313 and the second upper electrode 314 are formed by applying a plating of nickel (Ni) or gold (Au), etc., to a base material including tungsten (W) or molybdenum (Mo), etc., and have, e.g., a W/Ni/Au stacked structure.

(Sealing Part 26)

FIG. 3 is an enlarged view showing the sealing part 26. Note that, the insulation layer 25 is omitted in FIG. 3 for convenience of explanation. Also note that dimension of some part of the configuration depicted in FIG. 3 is reduced in the vertical direction of the drawing for convenience of explanation, and the dimensional ratio of thicknesses of constituent elements thus do not necessarily match between FIG. 2 and FIG. 3. As shown in FIG. 3, the sealing part 26 joins and seals between the mounting substrate 3 and the first electrode 23 which also serves as the sealing member. The sealing part 26 includes gold-tin (AuSn) and is formed of, e.g., a gold-tin alloy containing 20 to 30% by weight of tin (Sn).

The sealing part 26 has a substantially rectangular frustum bell-bottom shape extending from the supporting substrate 20 toward the mounting substrate 3. In particular, on the outer side of the semiconductor light-emitting element 2, the sealing part 26 extends from the supporting substrate 20 toward the first upper electrode 313, starting from the bottom surface 20ca of the stepped part 20c of the supporting substrate 20 and ending at the upper surface of the first upper electrode 313. Preferably, the sealing part 26 entirely fills the inside of the stepped part 20c.

In addition, on the inner side of the semiconductor light-emitting element 2, the sealing part 26 extends from the n-type cladding layer 21b toward the first upper electrode 313, starting from the upper surface of the n-type cladding layer 21b, more particularly, from an intersection line between the upper surface of the n-type cladding layer 21b and the side surface of the first electrode 23, and ending at the upper surface of the first upper electrode 313.

The sealing part 26 has a flare portion 260 which is widened toward the mounting substrate 3 (toward the first upper electrode 313) so as to have a flare shape. In detail, the sealing part 26 has the flare portion 260 which is widened toward the first upper electrode 313 while extending in the outward direction of the semiconductor light-emitting element 2 on the outer side of the semiconductor light-emitting element 2 and is widened toward the first upper electrode 313 while extending in the inward direction of the semiconductor light-emitting element 2 on the inner side of the semiconductor light-emitting element 2. An outer surface 260a of the flare portion 260 preferably has a curved shape.

The tip end of the flare portion 260 in the outward direction of the semiconductor light-emitting element 2 protrudes outward beyond the tip end of the supporting substrate 20 in the outward direction of the semiconductor light-emitting element 2. Preferably, the position of the tip end of the flare portion 260 in the outward direction of the semiconductor light-emitting element 2 substantially coincides with the position of the tip end of the first upper electrode 313 in the outward direction of the semiconductor light-emitting element 2. Also, preferably, the position of the tip end of the flare portion 260 in the inward direction of the semiconductor light-emitting element 2 substantially coincides with the position of the tip end of the first upper electrode 313 in the inward direction of the semiconductor light-emitting element 2.

The height of the outer surface of the sealing part 26 is preferably 3 μm to 8 μm. The height of the inner surface of the sealing part 26 is preferably 1 μm to 3 μm.

The sealing part 26 is provided so as to cover the surface of the insulation layer 25. That is, the sealing part 26 integrally covers a portion of the supporting substrate 20 (in particular, the surface of the stepped part 20c), the side surface of the buffer layer 21a, the lateral and upper surfaces of the n-type cladding layer 21b, and the side surface of the first electrode 23, with the insulation layer 25 sandwiched therebetween (not shown in FIG. 3).

(Joint Part 27)

The joint part 27 joins between the second electrode 24 and the mounting substrate 3. The joint part 27 includes gold-tin (AuSn) and is formed of, e.g., a gold-tin alloy containing 20 to 30% by weight of tin (Sn), in the same manner as the sealing part 26.

(Manufacturing Method)

Next, an example of a method for manufacturing the semiconductor light-emitting device 1 will be generally described. The semiconductor light-emitting device 1 can be manufactured by, e.g., the following steps.

<Preparation of Semiconductor Light-Emitting Element 2>

(1) The second upper electrode 314 is arranged in the inner region 60 of the semiconductor light-emitting element 2 (which is composed of the supporting substrate 20 and the nitride semiconductor layer 21), and the first upper electrode 313 is then arranged seamlessly so as to surround the second upper electrode 314.

(2) It is processed in such a manner that the nitride semiconductor layer 21 is not exposed on the outer side of the first upper electrode 313. For example, the insulation layer 25 may be formed on the surface of the nitride semiconductor layer 21.

(3) AuSn solder is formed on the surfaces of the first electrode 23 and the second electrode 24 of the semiconductor light-emitting element 2.

<Mount to Mounting Substrate 3>

(4) Au stud bumps (not shown) for mounting the voltage regulating element 5 are formed on the mounting substrate 3.

(5) The voltage regulating element 5 is mounted on the mounting substrate 3 via the Au stud bumps.

(6) The mounting substrate 3 is placed in a mounting device (not shown) filled with a dry nitrogen atmosphere, or a dry air atmosphere (a mixture gas with oxygen concentration in a range of 3% to 20%).

(7) The temperature inside the mounting device is increased to a range of 280° C. to 308° C. or a range of 311° C. to 330° C. Here, 280° C. to 308° C. is the melting temperature of AuSn. It is preferable to avoid the temperature of 309° C. to 310° C. during mounting. This temperature of 309° C. to 310° C. is a temperature at which quartz glass is likely to come off from a packaging material when melting AuSn and sealing a lid member formed of quartz glass, etc., by a conventional manufacturing method.

(8) The semiconductor light-emitting element 2 is mounted on the mounting substrate 3 while checking the mounting position. At the time of mounting, the load is adjusted to a range of 10 g to 100 g.

Functions and Effects of the First Embodiment

By configuring as described above, it is possible to increase the sealing effect and thereby realize a highly reliable airtight sealing structure since the sealing part 26 is formed from the supporting substrate 20 to the first electrode 23, and it is also possible to suppress the semiconductor light-emitting element 2 from coming off from the mounting substrate 3 without performing, e.g., a process for stress reduction treatment. As a result, n-type AlGaN constituting the n-type cladding layer 21b can be suppressed from contacting the external air, and deterioration of the semiconductor light-emitting element 2 can be suppressed by further increasing airtightness at a portion where deterioration likely to start, such as a region outside the n-type cladding layer 21b.

In addition, by configuring as described above, it is possible to reduce the number of assembly members and assembly man-hours required to assemble a package, as compared to conventional semiconductor light-emitting devices in which the package with a lid member is used as the mounting substrate 3. As a result, it is possible to reduce the manufacturing cost.

In addition, by using the supporting substrate 20, which is part of the semiconductor light-emitting element 2, as a window member to provide airtight sealing, it is possible to seal the semiconductor light-emitting element 2 without using a light-transmitting lid member which is used in conventional semiconductor light-emitting devices. As such, by not providing a lid member which blocks light emitted from the semiconductor light-emitting element 2, it is possible to improve light output as compared to a conventional structure employing the lid member.

In addition, unlike, e.g., a conventional technique using a lid member, such as quartz glass, of which thermal expansion coefficient is largely different from that of the mounting substrate 3, the configuration not using the lid member has no risk of separation of the lid member from the mounting substrate 3 and thus can improve a yield.

Furthermore, by using sapphire to form the supporting substrate 20, it is possible to provide higher mechanical strength and chemical stability and it is possible to ensure strength and stability equivalent to those of semiconductor light-emitting elements having a structure using a conventional package for sealing.

Furthermore, it is possible to trap the dry nitrogen atmosphere or the dry air atmosphere when the semiconductor light-emitting element 2 is sealed on the mounting substrate 3, and as a result, the semiconductor light-emitting element 2 can have improved light emission characteristics and longer life. In sum, according to the invention, it is possible to provide the semiconductor light-emitting device 1 which satisfies high reliability and high light output characteristics.

<Modification 1>

The shape of the semiconductor light-emitting element 2 when viewed from above does not necessarily need to be a rectangular shape and may be a circular shape or a polygonal shape. Each of a line as a boundary between the inner region 60 and the intermediate region 62 and a line as a boundary between the intermediate region 62 and the outer rim region 61 when viewed from above may be a circular shape, a polygonal shape different from a rectangular shape, such as triangle or hexagon, or an irregular-shaped loop. The shape of each electrode may be also appropriately adjusted.

<Modification 2>

A reflective film or a reflective electrode (not shown) having a predetermined thickness may be further provided on the exposed portion of each layer within a gap region (see "R" in FIG. 2) formed between the semiconductor light-emitting element 2 and the mounting substrate 3 inside the semiconductor light-emitting device 1. When using the reflective film, it may be applied to the surfaces of the sealing part 26 and the insulation layer 25 inside the gap region R. This exerts a further effect such that light output (light extraction efficiency) can be further increased by reflection at the reflective film or reflective electrode, and at the same time, deterioration of the voltage regulating element 5 can be suppressed by reducing the amount of light that the voltage regulating element 5 receives. A process of forming the reflective film or reflective electrode may be inserted, e.g., between (1) and (2) in the manufacturing method described above.

Second Embodiment

Figure 4:
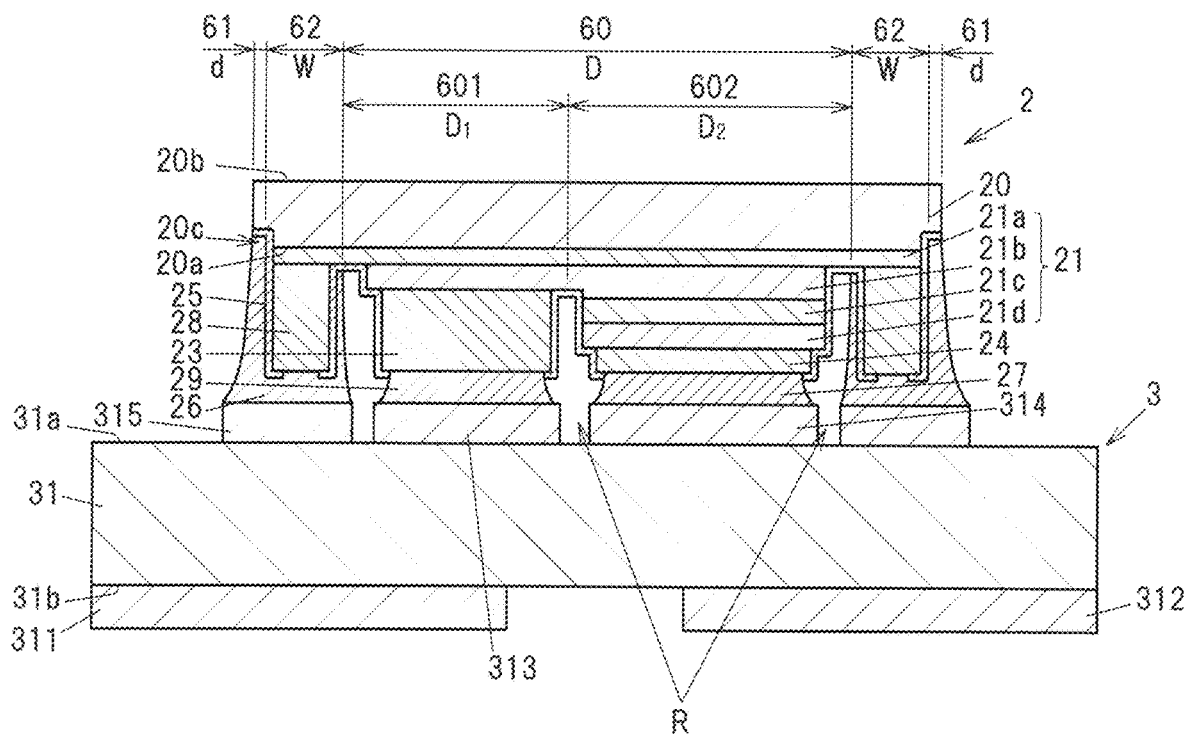
FIG. 4 is a schematic vertical cross-sectional view showing an example configuration of the semiconductor light-emitting device in the second embodiment of the invention.

Next, the second embodiment will be described in reference to FIG. 4. FIG. 4 is a schematic vertical cross-sectional view showing an example configuration of the semiconductor light-emitting device 1 in the second embodiment of the invention. The second embodiment is different from the first embodiment in that a frame-shaped sealing member 28 is provided separately from the first electrode 23 and the second electrode 24 of the semiconductor light-emitting element 2. In the following description of the second embodiment, the difference from the first embodiment will be mainly described.

(Semiconductor Light-Emitting Element 2)

The frame-shaped sealing member 28 is provided on the buffer layer 21a in the intermediate region 62. The sealing member 28 is formed of, e.g., a multilayered film formed by sequentially stacking Ti/Pt/Au or Cr/Pt/Au on the buffer layer 21a.

The n-type cladding layer 21b is provided on the buffer layer 21a only in the inner region 60. The first electrode 23 is provided on the n-type cladding layer 21b only in a first inner region 601. The first electrode 23 in this case does not need to have a sealing function since the sealing member 28 is provided. In the second embodiment, the second width D is preferably 1630 nm to 2395 and the third width W is preferably 5 µm to 35 µm.

The active layer 21c, the p-type cladding layer 21d and the second electrode 24 are sequentially formed in a second inner region 602 which is a region of the inner region 60 excluding the first inner region 601. A width D1 of the first inner region 601 here is, e.g., 430 nm to 695 nm. Meanwhile, a width D2 of the second inner region 602 is, e.g., 1200 nm to 1700 nm.

The insulation layer 25 further covers the side surface of the sealing member 28, in addition to the layers to be covered in the above-described first embodiment. The semiconductor light-emitting element 2 is mounted on the mounting substrate 3 in such a manner that the sealing member 28 faces the mounting substrate 3.

(Mounting Substrate 3)

The first upper electrode 313 of the mounting substrate 3 is provided on the upper surface 31a of the base part 31 at a position corresponding to the first electrode 23. The second upper electrode 314 is provided on the upper surface 31a of the base part 31 at a position corresponding to the second electrode 24. In addition, a sealing metal layer 315 is provided on the upper surface 31a of the base part 31 at a position corresponding to the sealing member 28. The sealing metal layer 315 is formed by, e.g., applying a plating of nickel (Ni) or gold (Au), etc., to a base material including tungsten (W) or molybdenum (Mo), etc.

(Sealing Part 26)

The sealing part 26 has a substantially rectangular frustum bell-bottom shape extending from the supporting substrate 20 toward the sealing metal layer 315. In particular, on the outer side of the semiconductor light-emitting element 2, the sealing part 26 extends from the supporting substrate 20 toward the sealing metal layer 315, starting from the bottom surface 20ca of the stepped part 20c of the supporting substrate 20 and ending at the upper surface of the sealing metal layer 315.

In addition, on the inner side of the semiconductor light-emitting element 2, the sealing part 26 extends from the buffer layer 21a toward the sealing metal layer 315, starting from the upper surface of the buffer layer 21a, more particularly, from an intersection line between the upper surface of the buffer layer 21a and the side surface of the first electrode 23, and ending at the upper surface of the sealing metal layer 315.

The sealing part 26 has the flare portion 260 which is widened toward the mounting substrate (toward the sealing metal layer 315) so as to have a flare shape. In detail, the sealing part 26 has the flare portion 260 which is widened toward the sealing metal layer 315 while extending in the outward direction of the semiconductor light-emitting element 2 on the outer side of the semiconductor light-emitting element 2 and is widened toward the sealing metal layer 315 while extending in the inward direction of the semiconductor light-emitting element 2 on the inner side of the semiconductor light-emitting element 2.

Preferably, the position of the tip end of the flare portion 260 in the outward direction of the semiconductor light-emitting element 2 substantially coincides with the position of the tip end of the sealing metal layer 315 in the outward direction of the semiconductor light-emitting element 2. Also, preferably, the position of the tip end of the flare portion 260 in the inward direction of the semiconductor light-emitting element 2 substantially coincides with the position of the tip end of the sealing metal layer 315 in the inward direction of the semiconductor light-emitting element 2.

The height of the outer surface of the sealing part 26 is preferably 3 μm to 8 μm. The height of the inner surface of the sealing part 26 is preferably 1 μm to 3 μm.

The sealing part 26 is provided so as to cover the surface of the insulation layer 25. That is, the sealing part 26 integrally covers a portion of the supporting substrate 20 (in particular, the surface of the stepped part 20c), the side surface of the buffer layer 21a, the side surface of the sealing member 28, and the side surface of the first electrode 23, with the insulation layer 25 sandwiched therebetween.

(Joint Parts 27, 29)

The joint part 27 described above in the first embodiment is provided as a first joint part 27, and a second joint part 29 joining between the first electrode 23 and the first upper electrode 313 is further provided. The second joint part 29 includes gold-tin (AuSn) and is formed of, e.g., a gold-tin alloy containing 20 to 30% by weight of tin (Sn), in the same manner as the first joint part 27.

Functions and Effects of the Second Embodiment

Also, in the second embodiment, it is possible to increase the sealing effect and thereby realize a highly reliable airtight sealing structure and it is also possible to suppress the semiconductor light-emitting element 2 from coming off from the mounting substrate 3 without performing a process for stress reduction treatment, in the same manner as the first embodiment.

Third Embodiment

Figure 5:
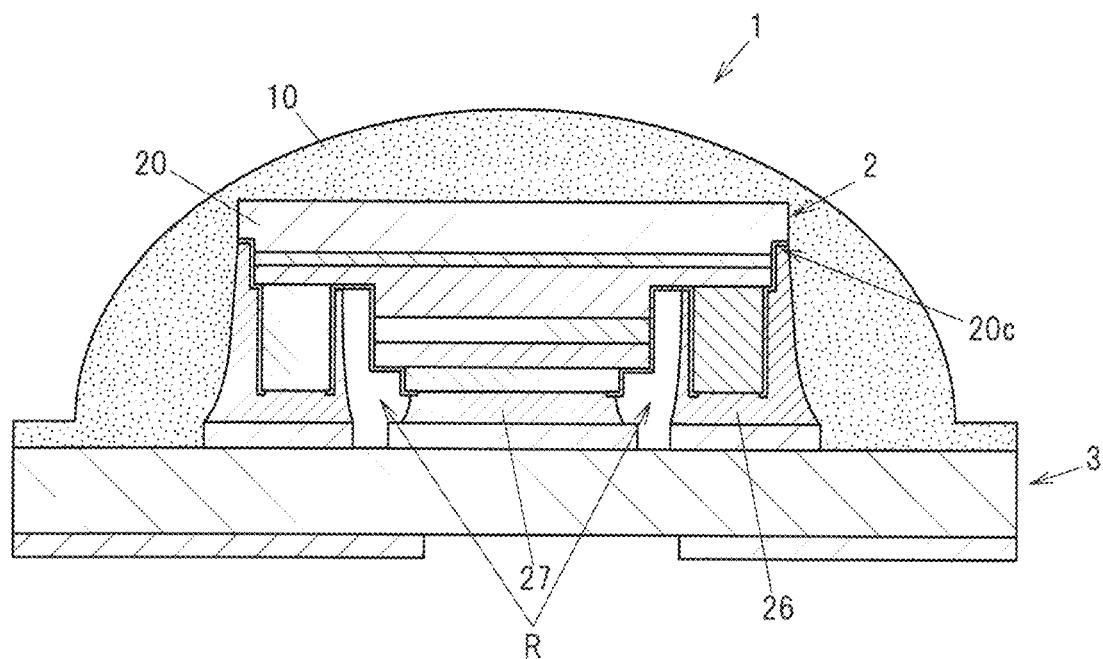
FIG. 5 is a schematic vertical cross-sectional view showing an example configuration of the semiconductor light-emitting device in the third embodiment of the invention.

Next, the third embodiment will be described in reference to FIG. 5. FIG. 5 is a schematic vertical cross-sectional view showing an example configuration of the semiconductor light-emitting device 1 in the third embodiment of the invention. The third embodiment is different from the above-described embodiments in that a protective resin layer 10 is provided around the semiconductor light-emitting element 2. In the following description of the third embodiment, the difference from the above-described embodiments will be mainly described.

The protective resin layer 10 covers the exposed portion of the semiconductor light-emitting element 2 mounted on the mounting substrate 3 and protects the semiconductor light-emitting element 2. The protective resin layer 10 is formed of a light-transmitting resin material. To increase light extraction efficiency, the protective resin layer 10 is preferably a material with a lower refractive index than that of the supporting substrate 20 which provides a light extraction surface. As the protective resin layer 10, it is possible to use, e.g., a fluorine-based resin, a silicone resin, an epoxy resin, etc. The protective resin layer 10 may serve as a lens by having a dome shape as shown in the drawing.

Functions and Effects of the Third Embodiment

Also, in the third embodiment, it is possible to increase the sealing effect and thereby realize a highly reliable airtight sealing structure and it is also possible to suppress the semiconductor light-emitting element 2 from coming off from the mounting substrate 3 without performing a process for stress reduction treatment, in the same manner as the first embodiment. In addition, since the resin material constituting the protective resin layer 10 does not easily enter the gap region R formed between the semiconductor light-emitting element 2 and the mounting substrate 3 inside the semiconductor light-emitting device 1, there is a further effect such that generation of halogen acid can be suppressed and deterioration can be thereby suppressed.

Fourth Embodiment

Figure 6:
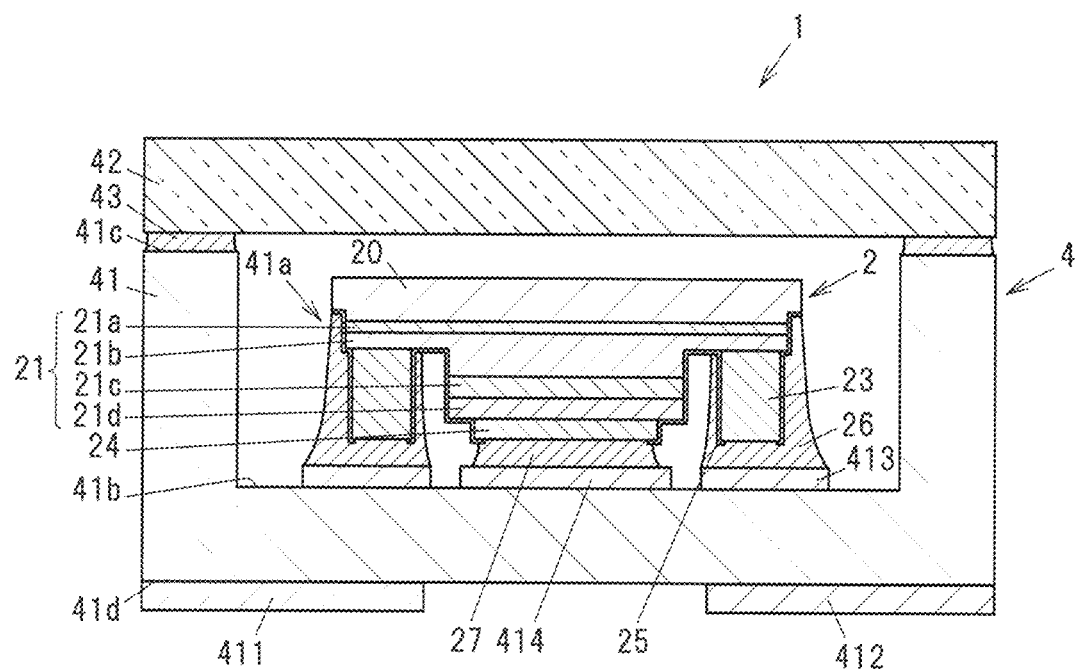
FIG. 6 is a schematic vertical cross-sectional view showing an example configuration of the semiconductor light-emitting device in the fourth embodiment of the invention.

Next, the fourth embodiment will be described in reference to FIG. 6. FIG. 6 is a schematic vertical cross-sectional view showing an example configuration of the semiconductor light-emitting device 1 in the fourth embodiment of the invention. The fourth embodiment is different from the above-described embodiments in that a package 4, which has a package substrate 41 housing the semiconductor light-emitting element 2 and a lid 42 provided as a cover on the package substrate 41, is further provided. In the following description of the fourth embodiment, the difference from the above-described embodiments will be mainly described.

(Package 4)

The package 4 has the package substrate 41 constituting a foundation part, the lid 42 joined to the package substrate 41, and an adhesive layer 43 joining the package substrate 41 and the lid 42 to each other. In particular, the lid 42 is attached to an upper surface 41c of the package substrate 41 via the adhesive layer 43. Thus, the lid 42 and the package substrate 41 are joined and integrated, and an inner space formed by the lid 42 and the package substrate 41 is airtight sealed from the outside.

As a material of the adhesive layer 43, it is possible to use, e.g., epoxy resin, acrylic resin, silicone resin, urethane resin, polyimide resin, polyamide resin, polyester resin, melamine resin, phenol resin, fluorine resin, etc.

On the package substrate 41, the semiconductor light-emitting element 2 is mounted. The package substrate 41 is an example of the mounting substrate. The package substrate 41 is formed in a substantially rectangular parallelepiped shape and has a recessed portion 41a which is formed on the upper surface for mounting the semiconductor light-emitting element 2. The package substrate 41 is an inorganic material substrate including ceramic. In particular, the package substrate 41 is constructed from, e.g., a high temperature co-fired ceramic (HTCC) multi-layered substrate.

The lid 42 is a plate-shaped window member which is transparent to deep ultraviolet light. The lid 42 is arranged so as to cover the recessed portion 41a of the package substrate 41. The lid 42 is, e.g., a glass lid including quartz ($SiO_2$) glass or sapphire ($Al_2O_3$).

A first lower electrode 411 and a second lower electrode 412 are provided on a lower surface 41d of the package substrate 41. On a bottom surface 41b of the recessed portion 41a of the package substrate 41, a first upper electrode 413 is provided at a position corresponding to the first electrode 23 and a second upper electrode 414 is provided at a position corresponding to the second electrode 24.

Functions and Effects of the Fourth Embodiment

In the fourth embodiment, it is possible to further increase the sealing effect and thereby realize a highly reliable airtight sealing structure, in addition to the effects obtained in each of the above-described embodiments.

<Modification 3>

Figure 7:
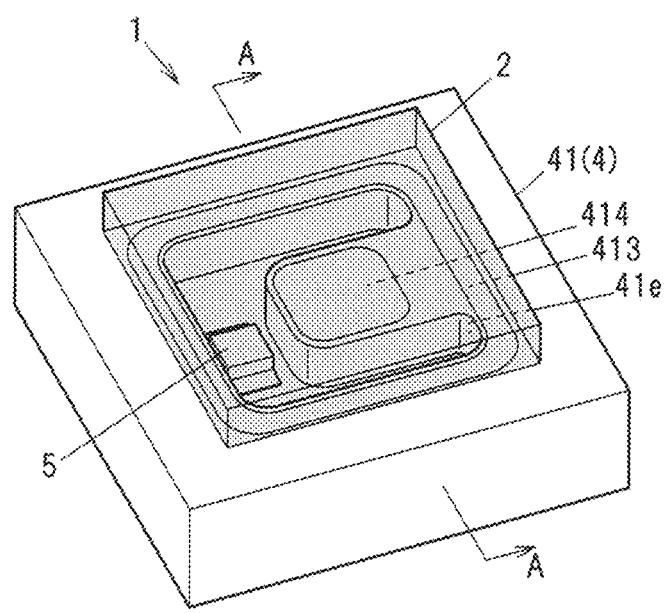
FIG. 7 is a schematic perspective view showing an example configuration of the semiconductor light-emitting device in a modification.
Figure 8:
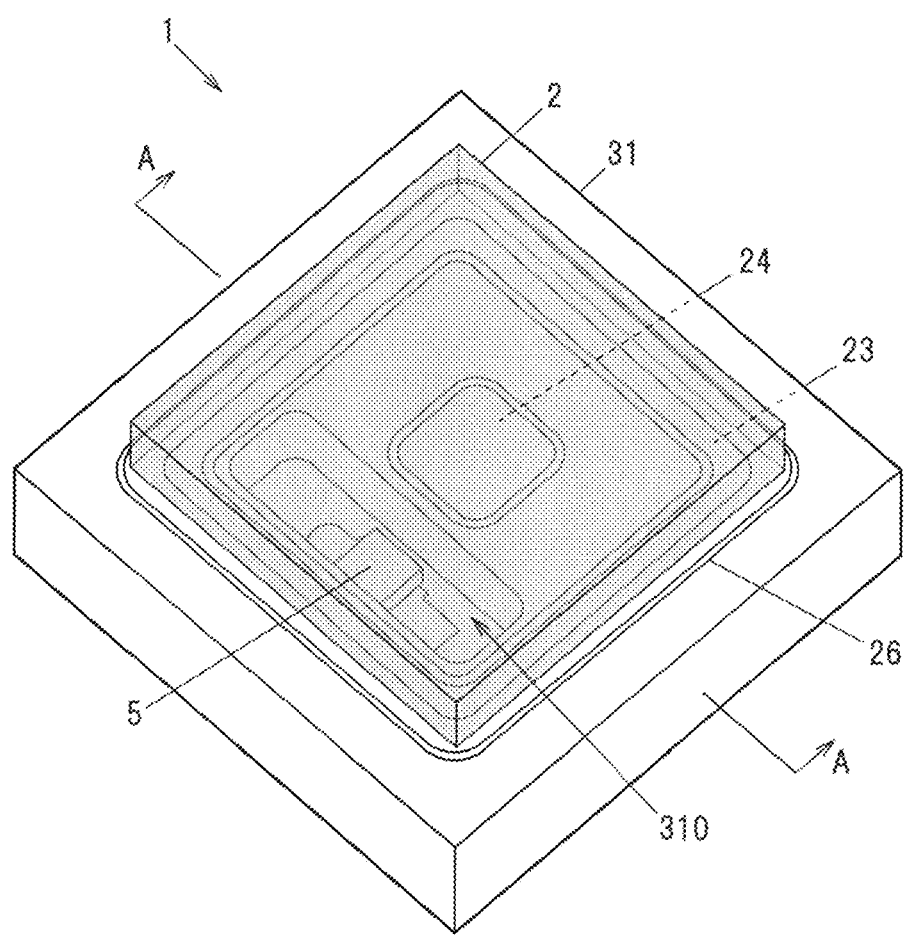
FIG. 8 is a schematic perspective view showing an example configuration of the semiconductor light-emitting device in the fifth embodiment of the invention.
Figure 9:
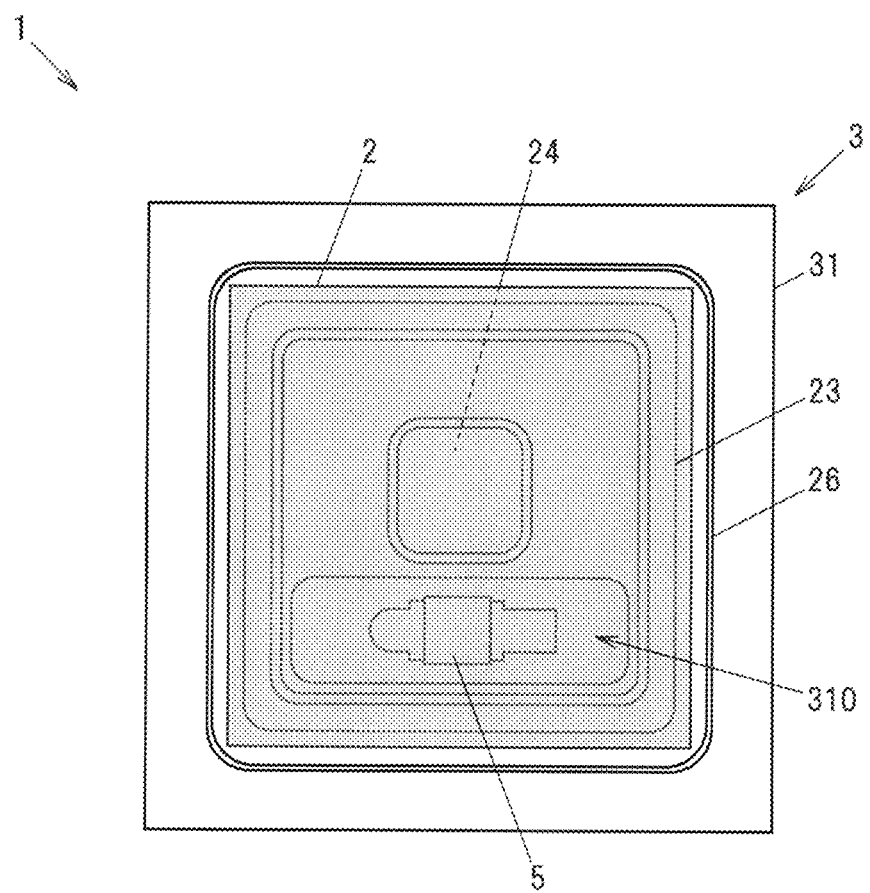
FIG. 9 is a plan view showing the semiconductor light-emitting device shown in FIG. 8.
Figure 10:
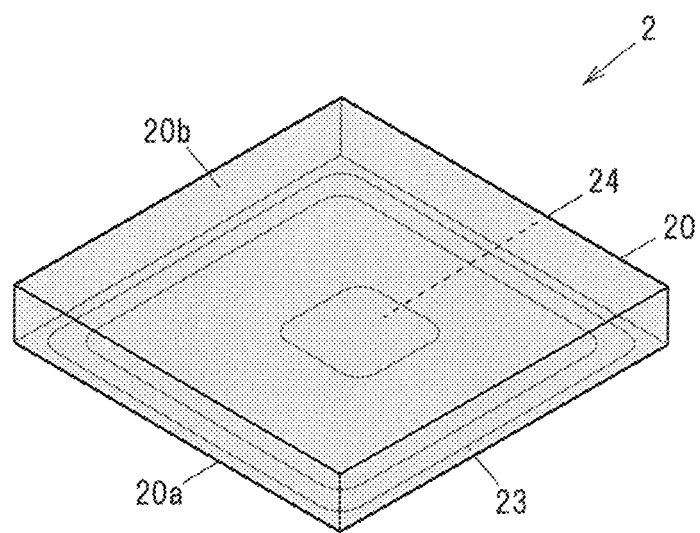
FIG. 10 is a perspective view showing a semiconductor light-emitting element extracted from the semiconductor light-emitting device shown in FIG. 8.
Figure 11:
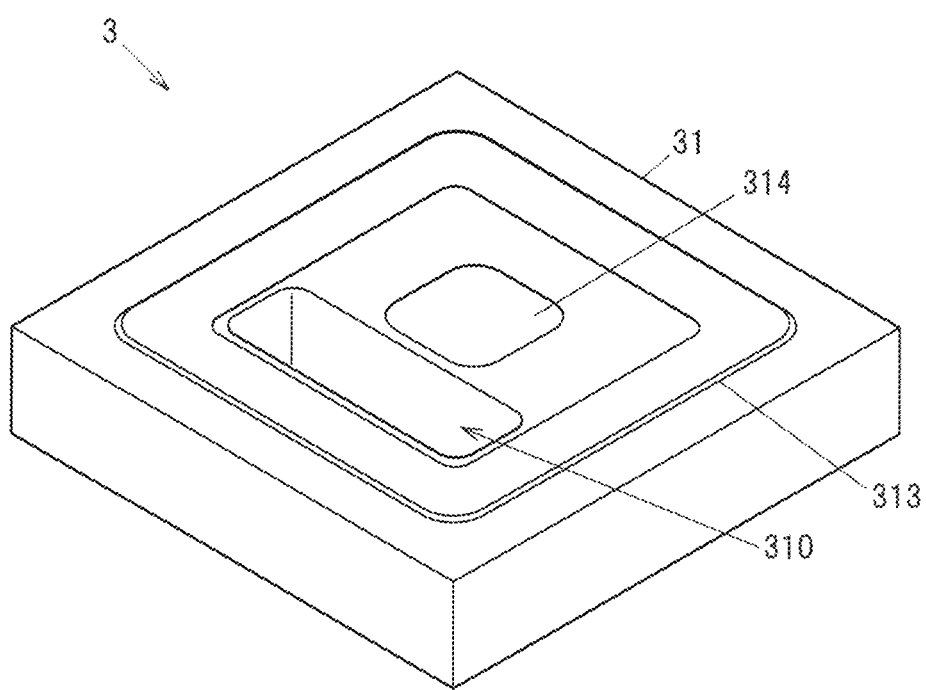
FIG. 11 is a perspective view showing a mounting substrate extracted from the semiconductor light-emitting device shown in FIG. 8.
Figure 12:
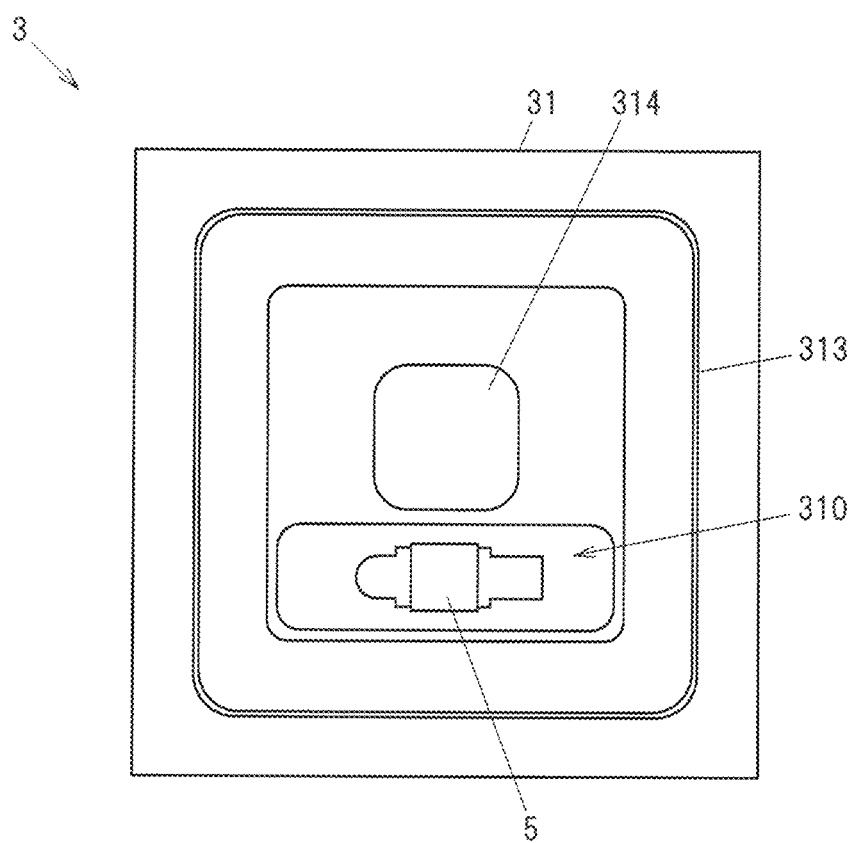
FIG. 12 is a plan view showing the mounting substrate shown in FIG. 11.

A modification will be described in reference to FIG. 7. FIG. 7 is a schematic perspective view showing an example configuration of the semiconductor light-emitting device in a modification. The lid 42 is omitted in FIG. 7. The second upper electrode 414 is arranged at the center of the semiconductor light-emitting element 2 so as to be separated from the inner walls of the recessed portion 41a of the package substrate 41 in the fourth embodiment, but may be arranged in contact with any one of the four inner walls of the recessed portion 41a of the package substrate 41 as shown in FIG. 7.

Preferably, the second upper electrode 414 is provided in contact with an inner wall 41e which is one of the four inner walls of the recessed portion 41a and faces the voltage regulating element 5 with the second upper electrode 414 in-between. When configured in this manner, the package substrate 41 of the invention can be formed using a conventional method in which the package substrate 41 is formed by stacking sheet-shaped ceramic members.

Fifth Embodiment

Next, the fifth embodiment will be described in reference to FIGS. 8 to 12. As shown in FIGS. 8 to 12, a housing hole 310 for housing the voltage regulating element 5 may be formed on the upper surface of the base part 31 of the mounting substrate 3. In other words, the mounting substrate 3 may have a structure with a cavity for housing the voltage regulating element 5.

The housing hole 310 has a rectangular parallelepiped shape and is arranged along and parallel to one side of the substantially square second upper electrode 314 in such a manner that heat generated by self-heating when supplying power to the semiconductor light-emitting element 2 is efficiently transferred to a lower surface part of the base part 31. This shape allows the heat transfer path to be increased. In addition, since it is possible to sufficiently dissipate heat during operation, it is possible to reduce thermal degradation of the semiconductor light-emitting element 2 and thus further improve reliability of the semiconductor light-emitting device 1.

Also, in the semiconductor light-emitting device 1 of the fifth embodiment, the sealing part 26 has the flare portion 260 which is widened toward the mounting substrate 3 so as to have a flare shape, even though illustration is omitted in FIGS. 8 to 12. In addition, to form the sealing part 26 in a flare shape, the stepped part 20c as shown in FIG. 3 is provided at widthwise edges of the supporting substrate 20 on the first principal surface side.

SUMMARY OF THE EMBODIMENTS

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A semiconductor light-emitting device (1), comprising: a semiconductor light-emitting element (2) comprising a supporting substrate (20) and a sealing member located above the supporting substrate (20); a mounting substrate (3) on which the semiconductor light-emitting element (2) is mounted in such a manner that the sealing member faces the mounting substrate (3); and a sealing part (26) that integrally covers a part of the supporting substrate (20) and a side surface of the sealing member and seals the semiconductor light-emitting element (2) and the mounting substrate (3).

[2] The semiconductor light-emitting device (1) described in the above [1], wherein the supporting substrate (20) comprises a stepped part (20c) formed at widthwise edges, and the sealing part (26) fills the stepped part (20c) and has a bell-bottom shape widened toward the mounting substrate (3) while extending in inward and outward directions of the semiconductor light-emitting element (2).

[3] The semiconductor light-emitting device (1) described in the above [1] or [2], wherein the semiconductor light-emitting element (2) further comprises an n-type cladding layer (21b) that is provided between the supporting substrate (20) and the sealing member, and the sealing part (26) further integrally covers a side surface of the n-type cladding layer (21b).

[4] The semiconductor light-emitting device (1) described in the above [1] or [2], further comprising: a reflective film that covers the sealing part (26) in a gap formed between the semiconductor light-emitting element (2) and the mounting substrate (3).

[5] The semiconductor light-emitting device (1) described in the above [3], further comprising: a reflective film that covers the sealing part (26) in a gap formed between the semiconductor light-emitting element (2) and the mounting substrate (3).

[6] The semiconductor light-emitting device (1) described in the above [1] or [2], further comprising: a protective resin layer (10) that comprises a resin and covers the semiconductor light-emitting element (2) to protect the semiconductor light-emitting element (2).

[7] The semiconductor light-emitting device (1) described in the above [3], further comprising: a protective resin layer (10) that comprises a resin and covers the semiconductor light-emitting element (2) to protect the semiconductor light-emitting element (2).

[8] The semiconductor light-emitting device (1) described in the above [4], further comprising: a protective resin layer (10) that comprises a resin and covers the semiconductor light-emitting element (2) to protect the semiconductor light-emitting element (2).

[9] The semiconductor light-emitting device (1) described in the above [5], further comprising: a protective resin layer (10) that comprises a resin and covers the semiconductor light-emitting element (2) to protect the semiconductor light-emitting element (2).

INDUSTRIAL APPLICABILITY

Provided is a semiconductor light-emitting device in which a semiconductor light-emitting element can be suppressed from coming off from a mounting substrate without performing stress reduction treatment.

REFERENCE SIGNS LIST

1: semiconductor light-emitting device
2: semiconductor light-emitting element
20: supporting substrate
20c: stepped part
21b: n-type cladding layer
26: sealing part
28: sealing member
3: mounting substrate
10: protective resin layer

The invention claimed is:

1. A semiconductor light-emitting device, comprising:
   a semiconductor light-emitting element comprising a supporting substrate and a sealing member located above the supporting substrate;
   a mounting substrate on which the semiconductor light-emitting element is mounted in such a manner that the sealing member faces the mounting substrate; and
   a sealing part that integrally covers a part of the supporting substrate and a side surface of the sealing member and seals the semiconductor light-emitting element and the mounting substrate;
   wherein the supporting substrate comprises a stepped part formed at widthwise edges, and the sealing part fills the stepped part and has a bell-bottom shape widened toward the mounting substrate while extending in inward and outward directions of the semiconductor light-emitting element.

2. The semiconductor light-emitting device according to claim 1, further comprising:
   a protective resin layer that comprises a resin and covers the semiconductor light-emitting element to protect the semiconductor light-emitting element.

3. The semiconductor light-emitting device according to claim 1, further comprising:
   a reflective film that covers the sealing part in a gap formed between the semiconductor light-emitting element and the mounting substrate.

4. The semiconductor light-emitting device according to claim 3, further comprising:
   a protective resin layer that comprises a resin and covers the semiconductor light-emitting element to protect the semiconductor light-emitting element.

5. The semiconductor light-emitting device according to claim 1, wherein the semiconductor light-emitting element further comprises an n-type cladding layer that is provided between the supporting substrate and the sealing member, and the sealing part further integrally covers a side surface of the n-type cladding layer.

6. The semiconductor light-emitting device according to claim 5, further comprising:
   a protective resin layer that comprises a resin and covers the semiconductor light-emitting element to protect the semiconductor light-emitting element.

7. The semiconductor light-emitting device according to claim 5, further comprising:
   a reflective film that covers the sealing part in a gap formed between the semiconductor light-emitting element and the mounting substrate.

8. The semiconductor light-emitting device according to claim 7, further comprising:
   a protective resin layer that comprises a resin and covers the semiconductor light-emitting element to protect the semiconductor light-emitting element.

* * * * *